United States Patent [19]

Baker

[11] Patent Number: 4,470,025

[45] Date of Patent: Sep. 4, 1984

[54] METHOD AND CIRCUITRY FOR CHIRPED OSCILLATOR AUTOMATIC FREQUENCY CONTROL

[75] Inventor: Lewin T. Baker, Schenectady, N.Y.

[73] Assignee: General Electric Company, Schenectady, N.Y.

[21] Appl. No.: 331,491

[22] Filed: Dec. 17, 1981

[51] Int. Cl.³ ............................................ H03B 23/00
[52] U.S. Cl. ................................. 331/178; 331/1 A; 331/4; 331/14; 307/228; 328/184
[58] Field of Search ....................... 331/1 A, 4, 10, 11, 331/14, 17, 25, 178; 328/184; 307/228, 271, 491

[56] References Cited

U.S. PATENT DOCUMENTS

| | | | |
|---|---|---|---|
| 3,504,294 | 3/1970 | Martin, Jr. | 331/4 |
| 3,710,274 | 1/1973 | Basse et al. | 331/14 X |
| 4,105,946 | 8/1978 | Ikeda | 331/1 A |
| 4,342,007 | 7/1982 | Elliott | 331/4 |

*Primary Examiner*—Siegfried H. Grimm
*Assistant Examiner*—W. R. Paxman

*Attorney, Agent, or Firm*—Geoffrey H. Krauss; James C. Davis, Jr.; Marvin Snyder

[57] ABSTRACT

The starting frequency and sweep rate of a chirped frequency-shift-keyed oscillator are automatically controlled for correction of long-term drift. The substantially linear swept frequency output of the oscillator, during each of a successive multiplicity of swept frequency chirps, is counted and the count converted to an error signal utilized to control an appropriate potential in the oscillator circuit. The initial frequency is monitored, where the swept frequency range is small compared to the initial frequency, by counting the number of cyles during a chirp period in obtaining a first error signal from the total cycle count. The frequency-chirp ramp rate is monitored by counting the number of cycles during an initial portion, e.g. the first one-tenth, of the chirp interval, and comparing the count thus obtained with a frequency count obtained during an identical-length interval at the end of the frequency chirp; the count difference is utilized for automatic correction of change in frequency chirp sweep rate. Circuitry for implementation of initial frequency and/or sweep rate automatic correction is described.

26 Claims, 14 Drawing Figures

METHOD AND CIRCUITRY FOR CHIRPED OSCILLATOR AUTOMATIC FREQUENCY CONTROL

BACKGROUND OF THE INVENTION

The present invention relates to frequency-swept oscillator control and, more particularly, to a novel method and apparatus for automatic correction of initial frequency and/or sweep rate of a chirped-frequency-swept-keyed oscillator.

In co-pending allowed application Ser. No. 301,706, filed Sept. 14, 1981, assigned to the assignee of the present invention and incorporated by reference herein in its entirety, a method for digital data communication, over hostile media, utilizing chirped-frequency-shift-keyed signals is described and claimed. While this chirped-frequency-shift-keyed (CFSK) modulation system has proven to be a highly reliable technique for communication in certain circumstances, such as over the power circuits in a building and the like, the system requires chirped oscillators at separated locations to be synchronized in time and means for time synchronization is described and claimed in the aforementioned co-pending application. In some applications, the chirped oscillators must also be frequency synchronized. A method and means for automatically controlling the frequency of the chirped oscillators in such a system, particularly over a relatively long time interval (without manual adjustment thereof) is highly desirable to achieve system stability. Similarly, it is highly desirable to automatically control the sweep rate at which the oscillator frequency is chirped during each time interval in which a bit of digital data is transmitted.

It is known to automatically frequency control an oscillator having a continuously or slowly changing output frequency, such as the carrier frequencies found in AM and FM modulation systems. The frequency of a station oscillator is thus controlled to make it follow an incoming signal which is either a constant or continuously varying frequency. Such automatic frequency control approaches are not applicable in a system having CFSK modulation, as a carrier is not available for use as a reference and both the starting frequency and the sweep rate are desirably controlled. Accordingly, a method and means for providing initial frequency and/or sweep rate control in the swept oscillator of a CFSK modulation system is highly desirable.

BRIEF DESCRIPTION OF THE INVENTION

In accordance with the invention, the initial frequency during a chirp interval of a chirped oscillator is automatically controlled, to correct for long-term drift, by: counting the number of cycles during a chirp period; generating an error signal responsive to the counted number of cycles relative to the desired number of cycles in the chirp period; and adjusting the oscillator initial frequency to reduce the error signal substantially to zero. The ramp rate at which the chirped oscillator is frequency swept is automatically controlled for long-term drift by: counting the number of cycles during a first interval of fixed duration at the beginning of a swept-frequency chirp period; counting the number of carrier cycles during a second interval, of the same fixed duration as the first interval, at the end of the same chirp time interval; generating an error signal responsive to the difference in the initial and final portion counts; and adjusting the sweep rate of the oscillator frequency-controlling waveform in accordance with the error signal to reduce the error signal substantially to zero. Use of both initial frequency and sweep rate automatic correction causes the instantaneous frequency of the CFSK oscillator waveform to be substantially without error, over relatively long time intervals.

Apparatus for automatically correcting the drift in the initial frequency of a chirped oscillator includes: means for counting the number of swept-oscillator frequency cycles during a chirp period; means for storing the full-period count; means for converting the stored full-period count to an error voltage; and means for providing an initial-frequency voltage to the chirped oscillator with magnitude responsive to the error voltage and varying in manner to correct for long-term drift in the chirped oscillator initial frequency. Apparatus for automatically correcting drift in the sweep rate of a chirped oscillator includes: means for counting in a first direction the number of cycles during a first fixed-duration portion of chirp period and for counting a number of cycles, in a similar fixed-duration portion at the end of the chirp period, in another direction opposite to the first direction; means for storing the resulting difference count at the end of a chirp period; means for converting the difference count to another error voltage for application to the chirped oscillator to establish the sweep rate of the oscillator; and means for providing a sweep rate voltage to the chirped oscillator with magnitude responsive to this error voltage and varying in manner to correct for changes in the chirped oscillator sweep rate.

Accordingly, it is one object of the present invention to provide a novel method for controlling the sweep rate and/or the initial frequency of a chirped oscillator waveform.

It is another object of the present invention to provide novel circuitry for controlling the sweep rate and/or the initial frequency of a chirped oscillator.

These and other objects of the present invention will become apparent upon consideration of the following detailed description, when read in conjunction with the drawings.

DETAILED DESCRIPTION OF THE DRAWINGS

DETAILED DESCRIPTION OF THE INVENTION

Figure 1:
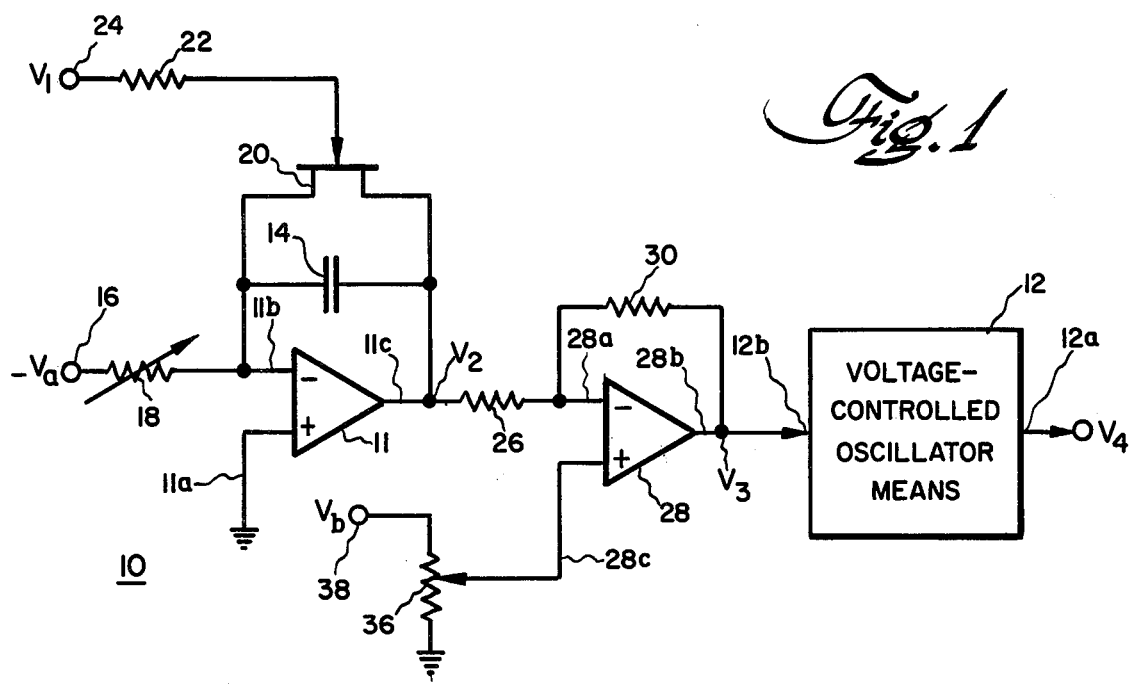
FIG. 1 is a schematic block diagram of a frequency-chirped oscillator to which the methods and circuitry of the present invention may be applied.

Referring initially to FIGS. 1 and 1a-1e, a chirped frequency-shift-keyed oscillator circuit 10, somewhat similar to that more fully described and claimed in the aforementioned co-pending application Ser. No. 301,706, utilizes a first operational amplifier 11 for forming a voltage ramp setting the sweep rate and duration of the chirped frequency-shift-keyed waveform to be provided at the output 12a of a voltage-controlled oscillator means 12. The non-inverting input 11a of the first operational amplifier is connected to electrical ground potential. An operational amplifier inverting input 11b is connected to the operational amplifier output 11c through an integrating capacitance 14, and to a source of a negative-polarity voltage ($-V_a$) input 16 through a resistance 18. Resistance 18 is preferably variable to allow at least initial setting of the chirped frequency ramp rate. The controlled (drain-source) circuit of a field-effect transistor 20 is connected in parallel with integrating capacitance 14, and the gate electrode thereof is connected through a resistance 22 to a first control input terminal 24 at which a reset voltage $V_1$ pulse is provided. The first operational amplifier output 11c is connected through a first summing resistance 26 to the inverting input 28a of a second operational amplifier 28. Input 28a is also connected to second operational amplifier output 28b through a feedback resistance 30. The non-inverting input 28c of the second operational amplifier is connected to the adjustable contact of a potentiometer 36, connected between ground potential and an input terminal 38, at which a frequency control voltage $V_b$ is provided. The second operational amplifier output 28b is connected to the frequency-control-voltage input 12b of the oscillator means 12.

Figure 1A:
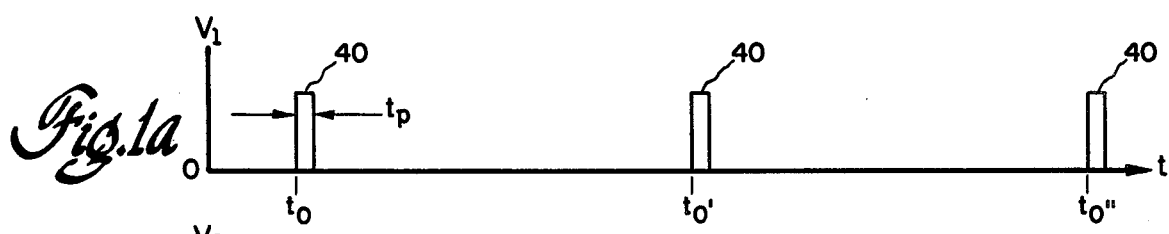
FIGS. 1a-1e are a set of coordinated graphs illustrating operational waveforms in the circuit of FIG. 1.
Figure 1B:
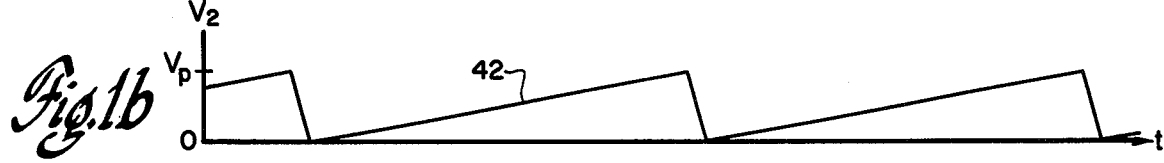
Figure 1C:
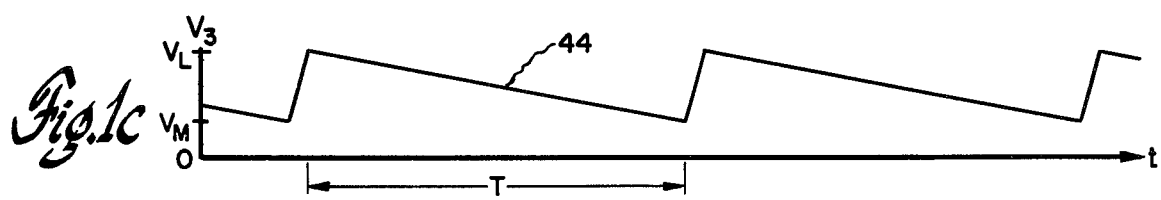
Figure 1D:
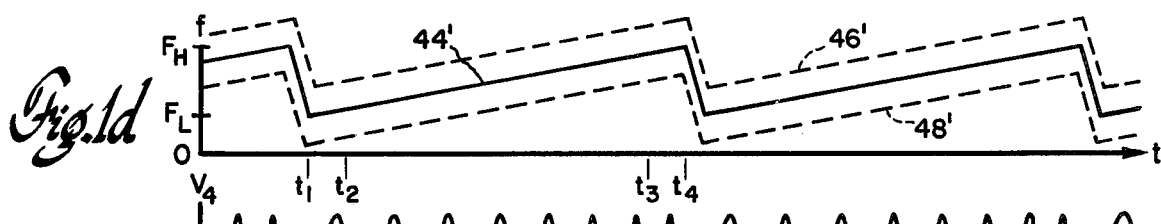
Figure 1E:
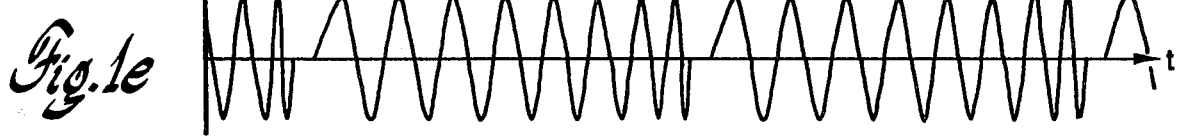

Briefly, in operation, a reset pulse 40, of pulse width $t_p$, is provided at the $V_1$ terminal 24 at the ending time $t_0$, $t_0'$, $t_0''$, etc. of each frequency chirp time interval (FIG. 1a). The amplitude of each pulse 40 is sufficient to cause transistor 20 to conduct and discharge integrating capacitance 14. At the end of each pulse 40, e.g. at time $t_1$, the transistor is in the cut-off condition, and the first operational amplifier output voltage $V_2$ (FIG. 1b) commences substantially linear ramping, with polarity opposite to the polarity of the voltage at terminal 16 and with a slope determined by the values of capacitance 14 and resistance 18. These values are selected such that the ramp voltage 42 reaches a maximum voltage $V_p$ at the end of a sweep time interval T, i.e. at time $t_4 = t_0'$. Ramp voltage $V_2$ is inverted by operational amplifier 28 to provide frequency-controlling voltage $V_3$ (FIG. 1c). The proportion of frequency-setting voltage $V_b$, at input 38, selected by the adjustment of potentiometer 36 establishes the starting voltage of the ramp. The initial ramp voltage, $V_L$, in conjunction with the ramp time period T, establishes the ramp voltage $V_M$ at the end of the time interval. These voltages correspond to maximum and minimum frequencies $F_H$ and $F_L$ (FIG. 1d). This swept-frequency (chirp) waveform may be, e.g., mixed with a frequency variable signal to transmit data. The resulting oscillator means output voltage $V_4$ waveform, in the time domain (FIG. 1e) is a substantially sinusoidal waveform of constantly changing frequency during a chirp ramp period, e.g. from time $t_1$ to time $t_4$. My novel method for automatic frequency control of a chirped frequency-shift-keyed oscillator, which linearly sweeps a frequency from a starting frequency $F_1$ to a terminal frequency $F_2$, utilizes the counting of the cycles of the output frequency waveform during each chirp period T and comparing the counted cycles against a desired cycle count with the result providing an error signal for correcting any undesirable variation in total cycles (long-term drift correction of the starting frequency $F_1$), or for controlling the sweep rate, i.e. the change in frequency per unit time.

The instantaneous frequency f(t) during a swept-frequency chirp is a function of the initial frequency $F_1$, the sweep rate R (equal to the frequency difference ($F_2-F_1$) divided by the chirp period T), and the chirp period T itself. Thus, for a desired linear frequency sweep, $$f(t) = F_1 + Rt = F_1 + (F_2 - F_1)t/T.$$

The foregoing is true for either a chirp 44' having the median frequency starting and ending frequencies $F_L$ and $F_H$ or the data-offsetted frequency chirps of waveforms 46' and 48', as the latter two chirp waveforms are offset by a constant amount from the substantially linear median-frequency chirp waveform 44'. The number of cycles N during a chirp period is therefore found by integrating the frequency f(t) relationship over the entire chirp period T and is $$N = F_1 T + RT^2/2.$$

It will be seen that if the swept frequency range, from initial frequency $F_1$ to final frequency $F_2$, is small compared to the starting frequency $F_1$, the number N of cycles during a chirp period T is much more sensitive to starting frequency $F_1$ than to sweep rate R. Accordingly, a first error signal $E_1$ can be obtained from the number N of cycles in the chirp period T for automatic correction of long-term drift in the starting frequency $F_1$. Further, by counting the number N' of cycles in the first one-tenth of the chirped period, i.e. from time $t_1$ to time $t_2$, and substracting this number N' from the number of cycles N'' in the last one-tenth of the chirped period, e.g. from time $t_3$ to $t_4$, another error signal $E_2$ can be derived for automatic correction of long-term drift in sweep rate R. Thus, $(N''-N')=0.09RT^2=E_2$. If a first control loop utilizes the sweep rate error signal $E_2$ for modifying the magnitude of the negative polarity integrator voltage $-V_a$ at input 16, then automatic correction of sweep rate error is achieved, while if a second control loop operates upon the magnitude $V_b$ of the frequency control voltage at input 38, then automatic control of the starting frequency long-term drift is provided.

Figure 2:
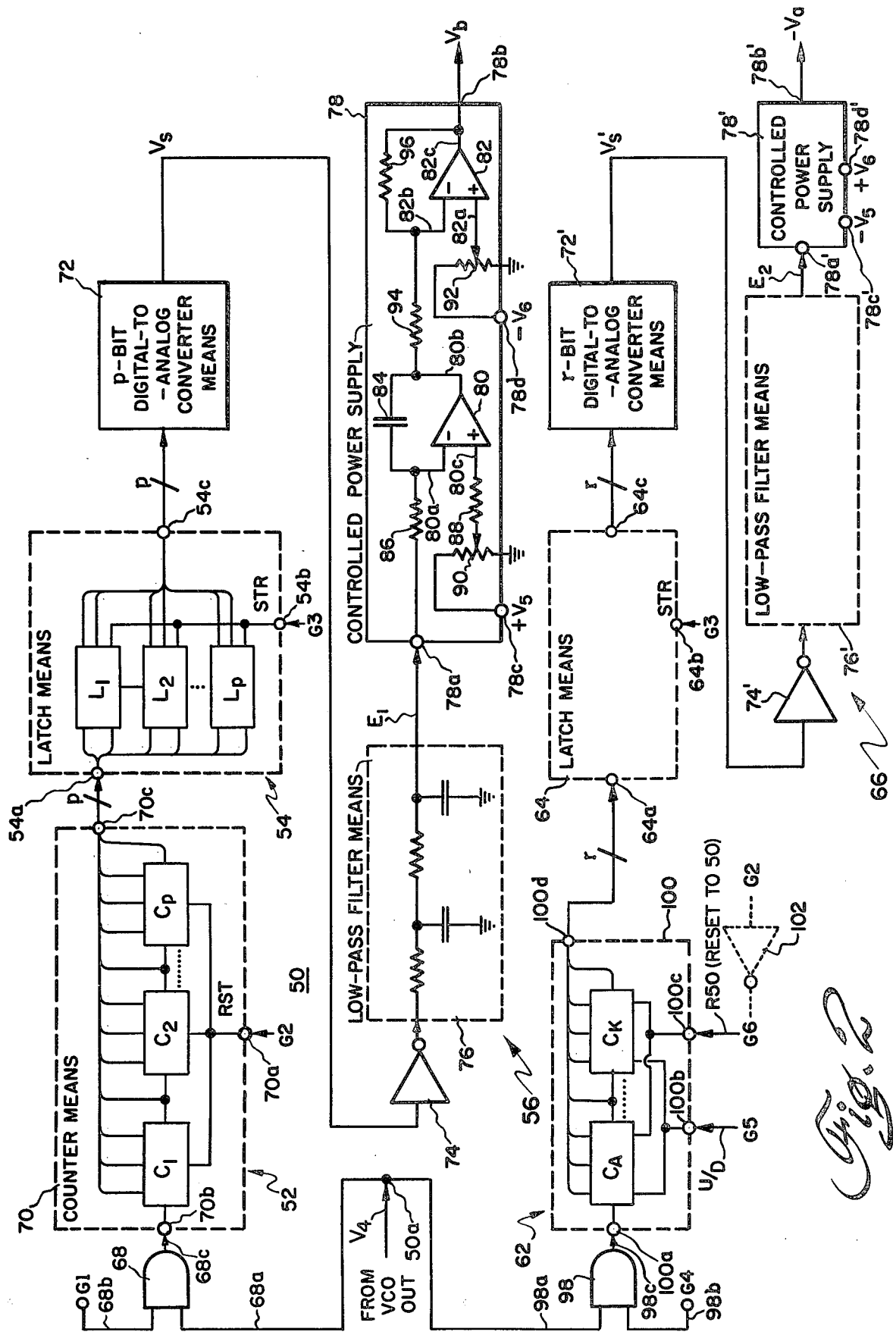
FIG. 2 is a schematic block diagram of a circuit, in accordance with the principles of the present application, for automatically controlling the sweep rate and the initial frequency of the frequency-chirped oscillator of FIG. 1.
Figure 2A:
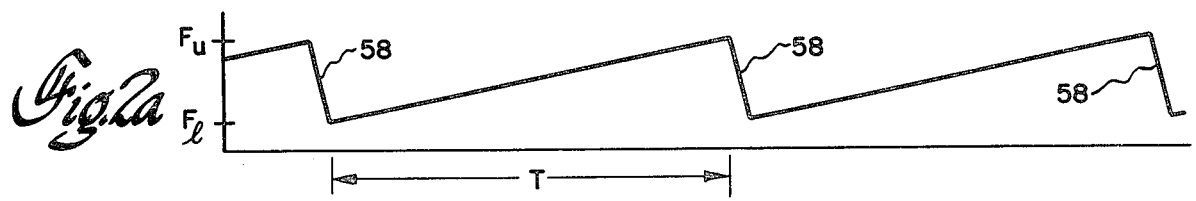
FIGS. 2a-2g are a set of coordinated graphs illustrating various signals in the circuitry of FIG. 2, and useful in understanding the operation thereof.

In accordance with one aspect of the invention, circuitry 50 (as shown in FIG. 2) for varying the initial-frequency voltage $V_b$ to correct long-term starting frequency drift and for varying the sweep ramp voltage $V_a$ (i.e. the magnitude of the negative voltage at a controlled power supply output 78b') to correct sweep rate drift, receives a portion of the voltage-controlled oscillator (VCO) means output voltage 4 at an input 50a. The first error signal $E_1$ is obtained by: counting, in gated counting means 52, the number of chirped frequency waveform cycles during a chirp period T; storing the chirp period count in latch means 54 after the end of the chirp period; and converting the count, in a digital-count-to-error-voltage conversion means 56, to provide the error voltage $E_1$ proporational to the cycle count. At the end of each chirp, during the retrace period 58 (see FIG. 2a), e.g. when the signal rather rapidly changes from the ending frequency back to the starting frequency for the next chirp, counting means 52 is reset to a zero count, by a reset signal G2.

The ramp error signal $E_2$ is provided by use of a bidirectional counter 62, counting the number of cycles during the first predetermined portion, e.g. the first one-tenth of the chirp period, in a first direction and then counting in the opposite direction during a similar-duration portion at the end of each chirp, e.g. the last one-tenth of the chirp time interval T. The count difference is stored in another latch means 64 and is then converted by means 66 from a digital count to a proportional voltage providing error signal $E_2$ and controlling the magnitude of voltage $-V_a$.

Figure 2B:
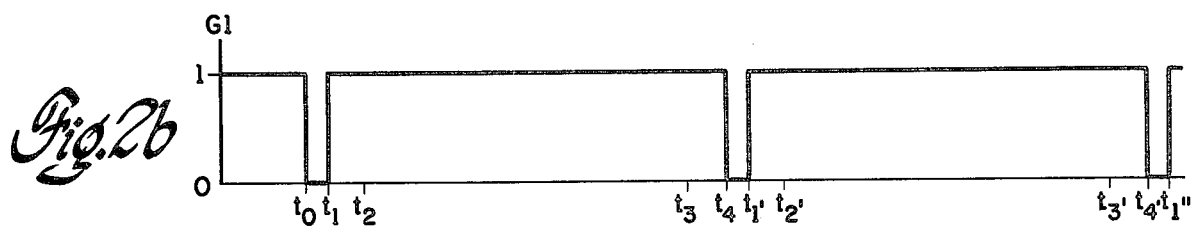
Figure 2C:
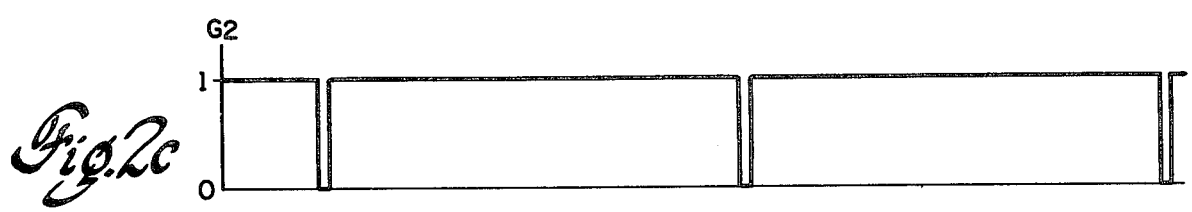

In the presently preferred embodiment of FIG. 2, first counting means 52 utilizes an AND gate 68 having a first input 68a connected to the automatic frequency control circuit input 50a and a second input 68b receiving the first gating signal $G_1$, provided by timing circuitry common to the communications system (and not shown for reasons of simplicity). Gating signal $G_1$ (FIG. 2b) is only at the logic zero level during the retrace time from $t_0$ to time $t_1$, when the frequency chirp waveform (FIG. 2a) is in its retrace portion 58, e.g. during the abrupt frequency change from the highest frequency $F_u$ to the lowest frequency $F_1$. The first gating waveform $G_1$ is at a logic 1 level for the duration of the swept frequency chirp, i.e. from time $t_1$ to time $t_4$. The number of cycles of the VCO waveform passing through gate 68 is counted during each sweep period in a p-bit counter means 70. Illustratively, counter 70 is a p=12 bit binary counter utilizing three 74163-type TTL or the like integrated circuits. The reset inputs of all counter chips $C_l$–$C_p$ are joined together to a reset RST input 70a, receiving the reset gating G2 signal (FIG. 2c). Thus, during the retrace 58 time, gate 68 is disabled by the logic zero level at G1 input and, for at least the latter portion of the retrace time (starting some time after time $t_0$ and ending no later than time $t_1$) the RST signal G2 goes from a logic 1 level to a resetting logic 0 level and resets all of counters $C_l$–$C_p$. At the beginning of the chirp time interval (time $t_1$), the reset waveform G2 returns to the logic 1 level and enables counter 70 to count the number of cycles of the gated VCO waveform appearing at a counter input 70b. The multiplicity of counter stage output lines are provided at a counter means digital output port 70c, carrying p parallelled counter stage output lines to the data input 54a of a p-bit latch means 54.

Figure 2D:
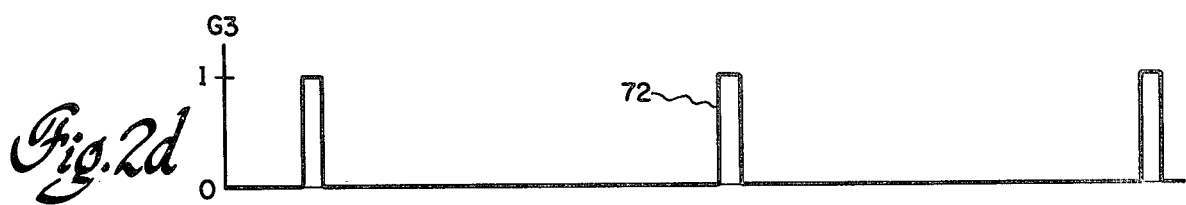

Latch means 54 utilizes p latch stages $L_l$–$L_p$, which may each be provided by a portion of a standard TTL 7475 integrated circuit or the like. Each stage receives one of the p counter bit lines at latch means input 54a. Each of the latch stages $L_l$–$L_p$ has a strobe input connected in parallel to a latch means strobe STR input 54b at which a third gating G3 signal (FIG. 2d) appears. The G3 gating signal has an effective edge 72, e.g. the positive-going edge, appearing just prior to time $t_4$, when all of the chirp cycles have been counted, but just prior to the resetting of counter means 70 by the G2 signal logic zero level. Upon application of the positive-going edge 72, the data from each of the p counter means stages is strobed into an associated one of the p latches and provided thereafter until changed, responsive to a next strobe, at a p-bit-wide latch means output port 54c. The p-bit parallel digital data is converted to an analog signal, of magnitude $V_s$, in a digital-to-analog converter means 72(such as a type AD7521 12-bit DAC or the like) forming the initial portion of means 56. The analog voltage is amplified by an inverting amplifier means 74 and then low-pass filtered by a low-pass filter means 76 to attenuate any counter quantizing steps appearing in the analog-converted signal. The resulting filtered analog error voltage $E_1$ is supplied to the input 78a of a controlled power supply 78 having its output 78b supplying the initial frequency-setting voltage $V_b$ to terminal 38 of the chirped oscillator of FIG. 1. Thus, the converted-digital analog voltage $V_s$ has magnitude proportional to the number of cycles counted in the previous chirp period T and becomes the error voltage $E_1$.

Controlled power supply 78 may, for example, utilize a pair of operational amplifiers 80 and 82, which may be provided by a single 747 dual-operational amplifier integrated circuit or the like. First operational amplifier 80 is an error integrator, having an integrating capacitance 84 connected between an inverting input 80a and an output 80b. An integration resistance 86 connects input 80a to power supply input 78a. The non-inverting input 80c is connected through a resistance 88 to the wiper arm of a potentiometer 90, connected between a first operating potential input 78c and ground potential. A non-inverting input 82a of the second operational amplifier is connected directly to the wiper arm of another potentiometer 92, itself connected between a second power supply operating potential input 78d and ground potential. An input resistance 94 is connected between the second operational amplifier input 82b and the first operational amplifier output 80b; a feedback resistance 96 is connected beteween input 82b and output 82c, from which output the control power supply output 78b is taken.

In the initial-frequency correcting portion of circuit 50, the voltages at power supply input 78c and 78d are of respective positive and negative polarities, e.g. $+V_5$ and $-V_6$. Amplifier 82 forms an off-set amplifier with the magnitude $V_b$ of the initial-frequency voltage being set by potentiometer 92, for a zero magnitude error $E_1$ signal. Potentiometer 90 is set such that the integration of the difference between the error $E_1$ voltage and the potentiometer 90 wiper arm voltage, over the chirp period, is of a magnitude which, when subtracted from the voltage at the potentiometer 92 wiper arm, controls voltage $V_b$ to compensate for changes, over time, in the initial frequency of the oscillator.

Figure 2E:
Figure 2F:
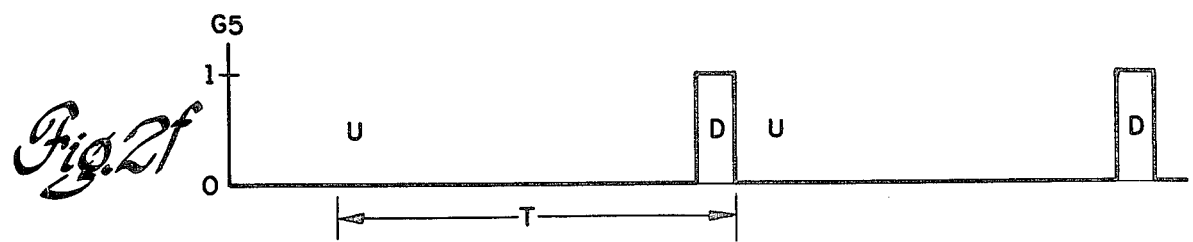
Figure 2G:
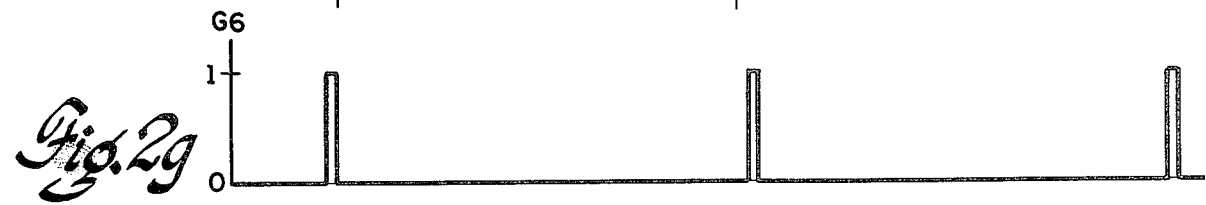

The sweep-rate-correcting portion of circuitry 50 utilizes second counting means 62, having another AND gate 98 and a K stage controllable up/down counter 100. A first input 98a of the gate is connected to receive the VCO signal from input 58, while a second gate input 98b receives a gating waveform $G_4$ (FIG. 2e). It will be seen that gating waveform $G_4$ is at the logic 1 level both for the first one-tenth of a chirp period, from time $t_1$ to time $t_2$, and during the last one-tenth of that chirp interval, from time $t_3$ to time $t_4$. The first and last segment gated portions of the waveform appear at the gate output 98c and are coupled to the up/down counter input 100a. The sequential-counting stages $C_A$–$C_K$ (which, in the illustrated embodiment, are a pair of standard TTL 74191 or the like integrated circuits) each have an up/down counting control line coupled to a counter up/down U/D input 100b, at which an up/down control signal $G_5$ is provided. The reset lines of the counter integrated circuits are connected in parallel to a reset input 100c, receiving another gating signal $G_6$, for resetting the count in the counter 100 to some predetermined initial count, e.g. the illustrated counter 100 is a reset-to-fifty (R50) counter. Thus, the $G_6$ reset waveform, which is the inverse of the $G_2$ reset waveform utilized for counter 70 and may be provided by an inverter 102 therefrom, occurs immediately prior to the start, at time $t_1$, of a chirp time interval T. At time $t_1$, counter 100 has been set to a predetermined initial count, e.g. to a count of 50, and gate 98 is opened by the logic 1 level of waveform G4 (FIG. 2e) from time $t_1$ to time $t_2$. Counter 100 is controlled to count up by the logic zero level (waveform of FIG. 2f) at the G5 direction input 100b. At time $t_2$, gate 98 is closed. The gate is again opened at time $t_3$, at which time the direction control input 100b receives a logic 1 level (waveform 2f) and begins downward counting. The gate is again closed at time $t_4$ and counter 100 now has a count therein related to the difference in the number of cycles counted during the latter and former portions of the chirped waveform. This difference count, contained in r bits of parallel data, is provided at the r-bit-wide counter output port 100d, to an r-bit-wide input port of an r-bit latch means 64. Latch means 64, which may be identical to latch means 54 except for a different number of latches therein, stores the data at input 64a responsive to leading edge 72 of the G3 waveform, at a latch means strobe input 64b. The latched data is thereafter available, until changed responsive to another strobe, at latch means output 64c. The latched r bits of data are provided to an r-bit digital-to-analog converter means 72', which may be of the same type as DAC means 72, for conversion to an analog voltage $V_s'$. This analog voltage is processed by an inverting amplifier 74', low-pass filtered in a low-pass filter means 76' and provided as the error signal $E_2$ to the input 78a' of another control power supply 78'. Controlled power supply 78' may be identical to power supply 78, with the exception that, for controlling the magnitude of voltage $-V_a$ for correcting initial frequency error, the polarities of the voltages $V_5$ and $V_6$ at power supply potential input 78c' and 78d' are opposite to the polarity of the voltages at power supply input 78c and 78d, in the particular embodiment illustrated. Thus, the difference between error signal $E_2$ and a portion of an input voltage $-V_5$ is integrated, applied to an off-set amplifier having its no-error-input value set by a potentiometer receiving voltage $V_6$, and the resulting error-corrected power supply voltage $(-V_a)$ is applied to the input 16 of the ramp generator of the chirped oscillator of FIG. 1. Thus, as there are more cycles in the last one-tenth of a chirp period T, then there are in the first one-tenth of that time interval, the counter will always have a final count, at the end of a chirp interval, less than the reset, e.g. 50, number if the sweep rate is correct. As the sweep rate increases, the final count decreases, while as the sweep rate decreases, the final count increases. The error voltage $E_2$ thus decreases as the sweep rate increases, causing the voltage $-V_a$ to decrease, along with the sweep rate. The sweep rate is thus automatically corrected.

While the present invention has been described with respect to one presently preferred embodiment thereof, many variations and modifications will now become apparent to those skilled in the art. It is my intent, therefore, to be limited only by the scope of the appending claims and not by the specific details presented by way of explanation herein.

What is claimed is:

1. A method for controlling the initial frequency of a chirped oscillator, comprising the steps of:
    (a) counting the number of cycles in the chirped oscillator waveform during a chirp period;
    (b) generating an error signal responsive to the counted number of cycles relative to the desired number of cycles in the chirp period;
    (c) comparing the magnitude of the error signal to the magnitude of a signal establishing a predetermined initial frequency; and
    (d) adjusting the oscillator initial frequency in accordance with the results of the comparing step (c) to reduce the error signal substantially to zero.

2. The method of claim 1, wherein step (a) includes the steps of: providing oscillator waveform cycle counter means; resetting the counter means to a zero count immediately prior to the start of the chirp period; and gating the oscillator waveform to the counter means during the chirp period after the counter means has been reset.

3. The method of claim 2, wherein step (a) further includes the step of: storing the counted number of chirp period cycles, prior to resetting the counter means for a next chirp period count.

4. The method of claim 1, wherein step (b) comprises the steps of: converting the counted number of chirp period cycles to an analog signal; and processing the analog signal to derive the error signal.

5. The method of claim 4, wherein said processing step includes the step of amplifying said analog signal.

6. The method of claim 5, wherein said processing step further includes the step of low-pass filtering the amplified analog signal.

7. The method of claim 1, further comprising the step of integrating the error signal prior to the comparing step.

8. A method for controlling the sweep rate of a chirped oscillator, comprising the steps of:
    (a) counting the number of cycles in the chirped oscillator waveform during a first interval of fixed duration at the beginning of a chirp period;
    (b) counting the number of cycles in the chirped oscillator waveform during a second interval, of the same fixed duration as the first interval, at the end of the same chirp period;
    (c) generating an error signal responsive to the difference in the first and second interval counts;
    (d) comparing the magnitude of the error signal to the magnitude of a signal establishing a predetermined sweep rate; and
    (e) adjusting the sweep rate of the chirped oscillator in accordance with the results of comparing step (d) to reduce the error signal substantially to zero.

9. The method of claim 8, wherein steps (a) and (b) comprise the steps of: providing a controllable up-down counting means; resetting the counting means to an initial count prior to the start of the chirp period; commanding the counting means to count in a first one of the up or down directions; gating the oscillator waveform to the counting means during the first interval; commanding, after the end of the first interval and prior to the start of the second interval, the counting means to count in the opposite one of the up or down directions; and gating the oscillator waveform to the counting means during the second interval.

10. The method of claim 9, further including the step of: storing, as a difference count, the final count in the counting means at the end of a chirp period, prior to resetting the counting means for the next chirp period count.

11. The method of claim 10, wherein step (c) comprises the steps of: converting the difference count to an analog signal; and processing the analog signal to derive the error signal.

12. The method of claim 11, wherein said processing step includes the step of amplifying said analog signal.

13. The method of claim 12, wherein said processing step further includes the step of low-pass filtering the amplified analog signal.

14. The method of claim 8, further comprising the step of integrating the error signal prior to the comparing step.

15. Apparatus for correcting the drift in the initial frequency of a chirped oscillator, comprising:
 means for counting the number of chirped oscillator frequency cycles during a chirp period;
 means for storing the chirp period count;
 means for converting the stored chirp period count to an error voltage; and
 controlled power supply means for providing an initial-frequency-setting voltage to the chirped oscillator with magnitude responsive to the error voltage and varying in manner to reduce the long-term drift in the chirped oscillator initial frequency substantially to zero, and including: first and second operational amplifiers each having an inverting input, non-inverting input and an output; an integration capacitor connected between the first operational amplifier inverting input and output; an integration resistance having a first end connected to said first operational amplifier inverting input and a second end receiving said error voltage; a first resistance element connected between said first operational amplifier output and said second operational amplifier inverting input; a second resistance element connected between said second operational amplifier inverting input and output; means for supplying first and second operating potentials of opposite polarity; and means connected between said operating potentials supplying means and each of said operational amplifier non-inverting inputs for establishing a desired magnitude of the initial-frequency-setting voltage for said chirped oscillator.

16. The apparatus of claim 15, wherein said counting means includes a resettable counter having a serial input and a plurality of counter stages, each stage having a data output and all stage data outputs being available in parallel, sufficient to count at least the largest number of chirped oscillator frequency cycles expected during the chirp period; and gating means for coupling the chirped oscillator frequency cycles to said counter serial input only during the chirp period.

17. The apparatus of claim 16, wherein said counter is reset prior to the beginning of each chirp period.

18. The apparatus of claim 16, wherein said storing means includes a plurality of latches each having a latch input connected to an associated one of the parallel data outputs of said counter stages, a latch output and a strobe input for causing binary data representing the count at the latch input to appear at the latch output responsive to a strobe signal.

19. The apparatus of claim 15, wherein said converting means includes a digital-to-analog converter having an input accepting parallel digital data representing the count from said storing means and an output at which an analog voltage appears with magnitude responsive to the digital data at the input of said converter; and means for changing the magnitude of the analog voltage to provide said error voltage.

20. The apparatus of claim 19, further comprising means for low-pass filtering the output of said magnitude changing means.

21. Apparatus for correcting drift in the sweep rate of a chirped oscillator, comprising:
 means for counting in a first direction the number of chirped oscillator frequency cycles during a first portion of a chirp period and for counting in a second and opposite direction the number of chirped oscillator frequency cycles during a second portion, of essentially equal duration as the first portion, of the chirp period;
 means for storing the difference count contained in said counting means at the end of the chirp period;
 means for converting the stored difference count to an error voltage; and
 controlled power supply means for providing a sweep-rate-setting voltage to the chirped oscillator with magnitude responsive to the error voltage and varying in manner to reduce the long-term drift in the chirped oscillator sweep rate substantially to zero, and including: first and second operational amplifiers each having an inverting input, a non-inverting and an output; an integration capacitor connected between the first operational amplifier inverting input and output; an integration resistance having a first end connected to said first operational amplifier inverting input and a second end receiving said error voltage; a first resistance element connected between said first operational amplifier output and said second operational amplifier inverting input; a second resistance element connected between said second operational amplifier inverting input and output; means for supplying first and second operating potentials of opposite polarity; and means connected between said operating potentials supplying means and each of said operational amplifier non-inverting inputs for establishing a desired magnitude of the sweep-rate-setting voltage for said chirped oscillator.

22. The apparatus of claim 21, wherein said counting means includes a resettable up/down counter having a serial input, an up/down count control input, and a plurality of counter stages, each stage having a data output and all stage data outputs being available in parallel, sufficient to count at least the largest number of chirped oscillator frequency cycles expected during each of the first and second portions; said up/down control input receiving a signal for counting respectively in said first and second directions during said first and second portions, respectively; and gating means for coupling the chirped oscillator frequency cycles to said serial input only during said first and second portions of the chirp period.

23. The apparatus of claim 22, wherein said counter is reset prior to the beginning of each chirp period.

24. The apparatus of claim 22, wherein said storing means includes a plurality of latches each having a latch input connected to an associated one of the parallel data outputs of said counter stages, a latch output and a strobe input for causing binary data representing the count at the latch input to appear at the latch output responsive to a strobe signal.

25. The apparatus of claim 21, wherein said converting means includes a digital-to-analog converter having an input accepting parallel digital data representing the count from said storing means and an output at which an analog voltage appears with magnitude responsive to the digital data at the input of said converter; and means for changing the magnitude of the analog voltage to provide said error voltage.

26. The apparatus of claim 25, further comprising means for low-pass filtering the output of said magnitude changing means.

* * * * *